(12) United States Patent
Adams et al.

(10) Patent No.: US 6,485,253 B1
(45) Date of Patent: Nov. 26, 2002

(54) EDGE GRIPPED SUBSTRATE LOADING AND UNLOADING METHOD

(75) Inventors: Joseph T. Adams, Sunnyvale, CA (US); Robert S. Kearns, Saratoga, CA (US)

(73) Assignee: Nanometrics Incorporated, Milpitas, CA (US)

( * ) Notice: Subject to any disclaimer, the term of this patent is extended or adjusted under 35 U.S.C. 154(b) by 0 days.

(21) Appl. No.: 09/875,420

(22) Filed: Jun. 5, 2001

Related U.S. Application Data

(62) Division of application No. 09/466,356, filed on Dec. 17, 1999, now Pat. No. 6,343,905.

(51) Int. Cl.[7] ............................................... B65G 49/07
(52) U.S. Cl. ..................... 414/806; 414/941; 198/346.2
(58) Field of Search ........................... 414/222.08, 806, 414/810, 811, 937, 938, 783, 941; 198/346.2

(56) References Cited

U.S. PATENT DOCUMENTS

| | | | |
|---|---|---|---|
| 4,345,866 A | 8/1982 | Greene | 414/224 |
| 5,052,886 A | 10/1991 | Moroi | 414/757 |
| 5,102,280 A * | 4/1992 | Poduje et al. | 414/783 X |
| 5,269,643 A | 12/1993 | Kodama et al. | 414/416 |
| 5,304,248 A | 4/1994 | Cheng et al. | 118/728 |
| 5,445,491 A | 8/1995 | Nakagawa et al. | 414/786 |
| 5,626,456 A * | 5/1997 | Nishi | 414/941 X |
| 5,636,960 A | 6/1997 | Hiroki et al. | 414/331 |
| 5,741,109 A | 4/1998 | Weisler et al. | 414/416 |
| 5,765,890 A | 6/1998 | Gaylord et al. | 249/65 |
| 5,788,452 A | 8/1998 | Brouwer et al. | 414/631 |
| 5,834,737 A | 11/1998 | Hirose et al. | 219/385 |
| 5,855,687 A | 1/1999 | DuBois et al. | 118/729 |
| 5,911,461 A | 6/1999 | Sauter et al. | 294/1.1 |
| 5,913,429 A | 6/1999 | Han | 211/41.18 |

OTHER PUBLICATIONS

Problem Solving Report Question No.–0926473.061 "Wafer Grippers", NERAC® (1999), 63 pages.
Nanometrics NanoSpec® 9000 information sheet, 1 page back and front.
Nanometrics NanoSpec® 9000i and NanoSpec® 9000b information sheet, 1 page back & front.

* cited by examiner

*Primary Examiner*—Donald W. Underwood
(74) *Attorney, Agent, or Firm*—Silicon Valley Patent Group LLP; Michael J. Halbert

(57) ABSTRACT

A substrate lift mechanism includes a plurality of fingers mounted on a hoop controlled by an actuator to transfer a substrate, such as a wafer or a flat panel display, from an edge grip arm to a chuck on a processing tool, such as integrated metrology tools. The substrate lift mechanism includes a base that is configured to be mounted to existing processing tools thereby allowing the processing tools to be adapted to be operable with new edge grip arms. The plurality of fingers are positioned to permit an edge grip arm to pass between two of the fingers and are configured to gravitationally support the substrate. Advantageously, the base of the substrate lift mechanism has a small footprint to minimize the space requirements of the processing tool to which it is mounted.

10 Claims, 5 Drawing Sheets

EDGE GRIPPED SUBSTRATE LOADING AND UNLOADING METHOD

CROSS REFERENCE TO RELATED APPLICATION

This application is a divisional of U.S. patent application Ser. No. 09/466,356, filed Dec. 17, 1999, now U.S. Pat. No. 6,343,905, entitled "Edge Gripped Substrate Lift Mechanism".

FIELD OF THE INVENTION

The present invention relates to an apparatus and method for transferring a substrate, such as a wafer or flat panel display, from a robotic transfer arm to a desired location, such as on a processing tool, and in particular for transferring a substrate from a robotic edge grip arm to a chuck on a processing tool.

BACKGROUND

Substrates, such as semiconductor wafers or flat panel displays, are typically moved from one processing station to the next using robotic transfer arms. The newest type of arm is an edge grip arm, which grips only the leading and trailing edges of the substrate as it is transported. By gripping only the leading and trailing edges of the substrate, there is only a small amount of contact and, thus, possibility of particulate contamination is reduced. One such edge grip arm is manufactured by, e.g., Kensington Laboratories, Inc, located in Richmond Calif.

Many processing tools, e.g., integrated metrology tools, use a chuck as a substrate holding device. Unfortunately, many new edge grip arms cannot place a substrate on a conventional chuck because the configuration of the edge grip arms interferes with the chuck. Redesigning chucks to cooperate with the edge grip arms is undesirable due to the expense and time that would be required.

Thus, what is needed is a substrate lift mechanism that cooperates with edge grip arms and may be integrally included in new products as well as easily mounted to existing processing tools.

SUMMARY

A substrate lift mechanism in accordance with the present invention includes a plurality of fingers, e.g., at least three fingers and preferably four fingers, controlled by an actuator or actuators to transfer a substrate, such as a wafer or a flat panel display, from an edge grip arm to a chuck on a processing tool, such as integrated metrology tools. The plurality of fingers, in one embodiment, are mounted on a hoop controlled by an actuator. The substrate lift mechanism includes a base, an actuator positioned in the base, and at least two arms coupled to the actuator with the arms moving in an upward and downward direction by the actuator. The substrate lift mechanism also includes a plurality of fingers extending from the arms with the fingers positioned such that an edge grip arm may pass between two of the fingers. The fingers are configured to gravitationally support the substrate. The fingers include positioning nipples to precisely position the substrate over the fingers. The actuator is ideally a small sized actuator, such as a pneumatic actuator, to minimize the size of the base. Consequently, the footprint of the substrate lift mechanism is minimized. The actuator may be controlled, e.g., by a micro-switch that is activated from movement of the Z stage of the processing tool itself.

A method of using the substrate lift mechanism includes positioning the fingers mounted on hoop in an up position; positioning a substrate held on an edge grip arm over the plurality of fingers; lowering the edge grip arm to place the substrate on the plurality of fingers; retracting the edge grip arm from between two of the plurality of fingers; and lowering the hoop to a down position to place the substrate on a chuck of a processing tool to which the substrate lift mechanism is mounted. The substrate is unloaded by raising the hoop to the up position to place the substrate on the fingers; extending the edge grip arm between two of the fingers; raising the edge grip arm to place the substrate on the edge grip arm; and retracting the edge grip arm to remove said substrate from said processing tool.

With the use of the substrate lift mechanism in accordance with the present invention, existing tools may be adapted to be used with the new edge grip arms without requiring a redesign of the chuck system and without a substantial increase in the footprint of the device.

DETAILED DESCRIPTION

Figure 1A:
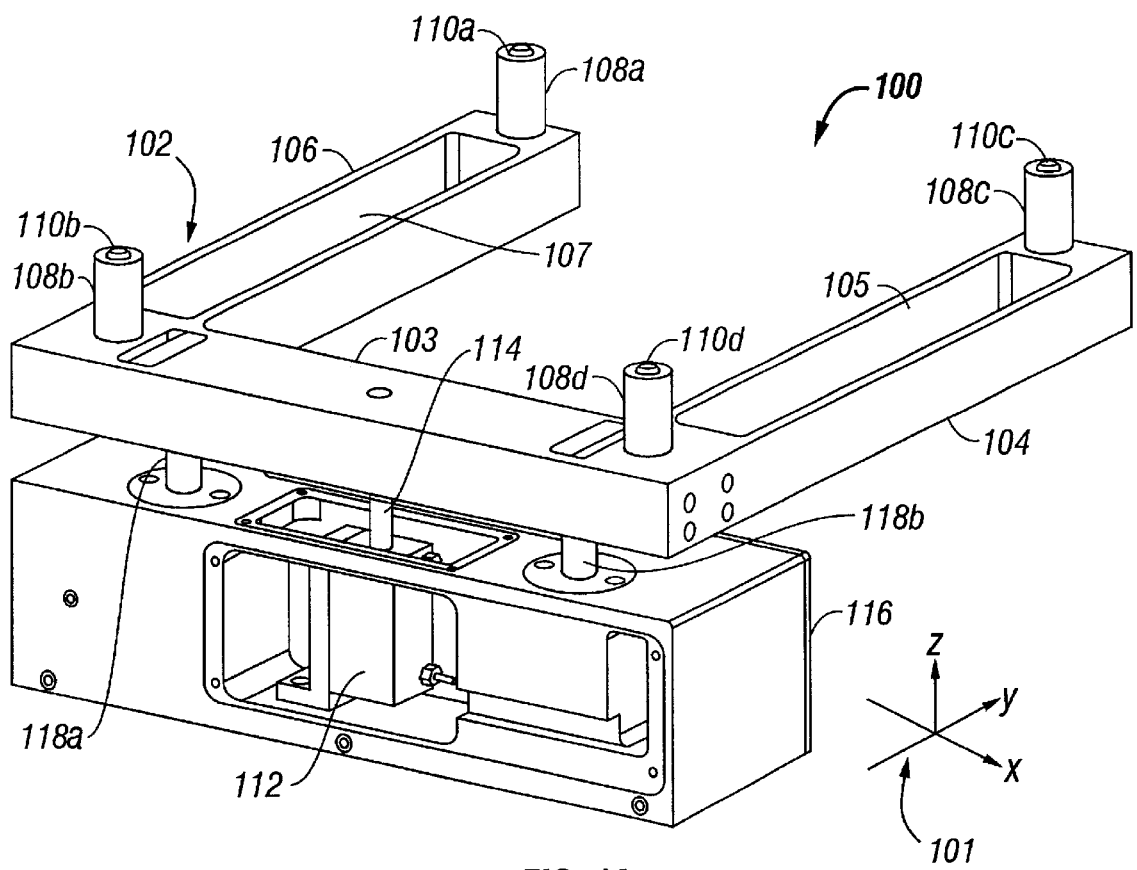
FIG. 1A shows a perspective view of a substrate lift mechanism in accordance with the present invention.

FIG. 1A shows a perspective view of a substrate lift mechanism 100 in accordance with the present invention. As shown in FIG. 1A, substrate lift mechanism 100 includes a hoop 102 having two arms 104, 106 connected by cross bar 103 and fingers 108a, 108b, 108c, and 108d positioned to engage the edges of a substrate to be lifted. Each finger 108a–108d has a positioning nipple 110a–110d that ensures the substrate is properly positioned on substrate lift mechanism 100. Fingers 108a and 108c are positioned at the ends of arms 106 and 104, respectively. Fingers 108b and 108d are positioned at the other end of arms 106 and 104, respectively, or may be said to be mounted at the ends of cross bar 103.

Substrate lift mechanism 100 moves hoop 102 in the Z coordinate direction, as indicated by X, Y, Z, coordinate axes 101. An actuator 112, which may be, e.g., a pneumatic cylinder, drives hoop 102 up and down in the Z direction by way of an intermediate linking arm 114. Actuator 112 is positioned within a base 116, which is held stationary. A pair of linear bearing 118a, 118b are used to guide the movement of hoop 102, however, if desired, fewer or more bearings may be used. Linear bearings 118a, 118b should be precision bearings, for example, model LSAG bearings manufactured by IKO Nippon Thompson Co., Ltd, of Japan. If desired, fingers 108a–108d need not be mounted on a hoop, and maybe controlled, e.g., by independent actuators.

Figure 1B:
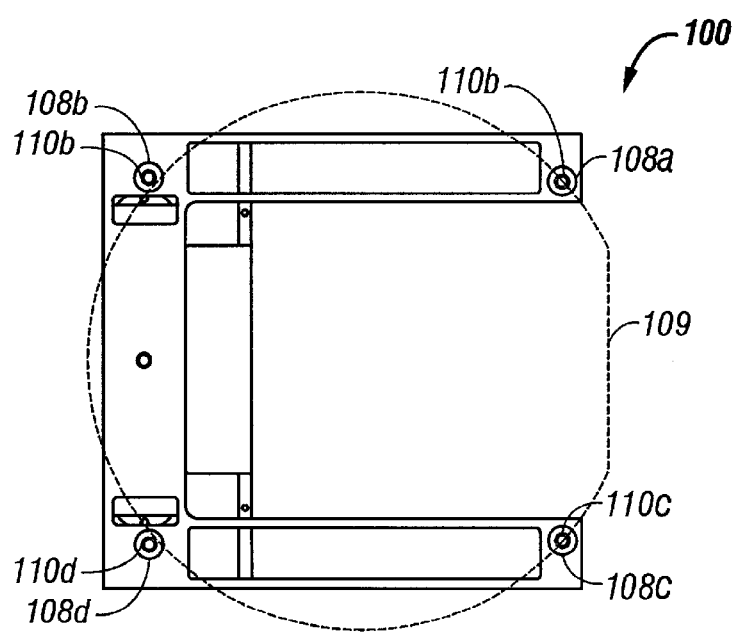
FIG. 1B shows a top view of the substrate lift mechanism with a substrate (shown with dotted lines) positioned on a plurality of fingers.

FIG. 1B shows a top view of substrate lift mechanism 100 with a substrate 109 (shown with dotted lines) gravitationally supported on fingers 108a–108d. As shown in FIG. 1B, substrate 109 is precisely positioned so as to be centered over fingers 108a–108d by positioning nipples 110a–110d.

Figure 2:
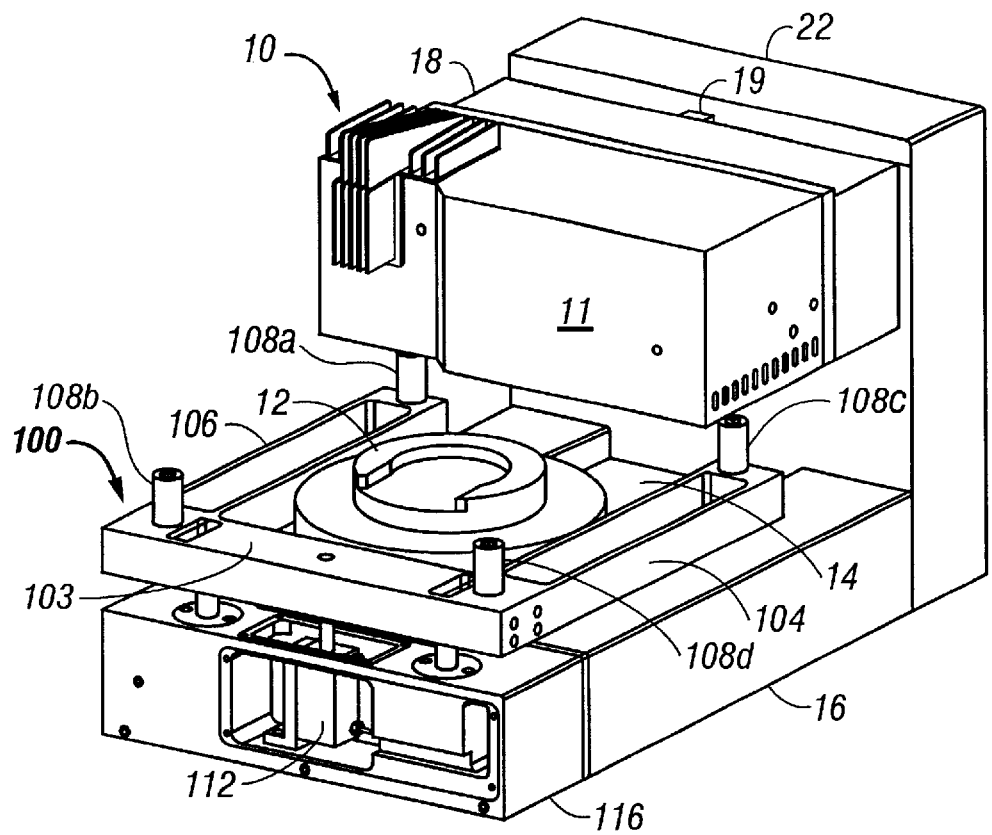
FIG. 2 shows a perspective view of the substrate lift mechanism coupled to an integrated metrology tool.
Figure 3:
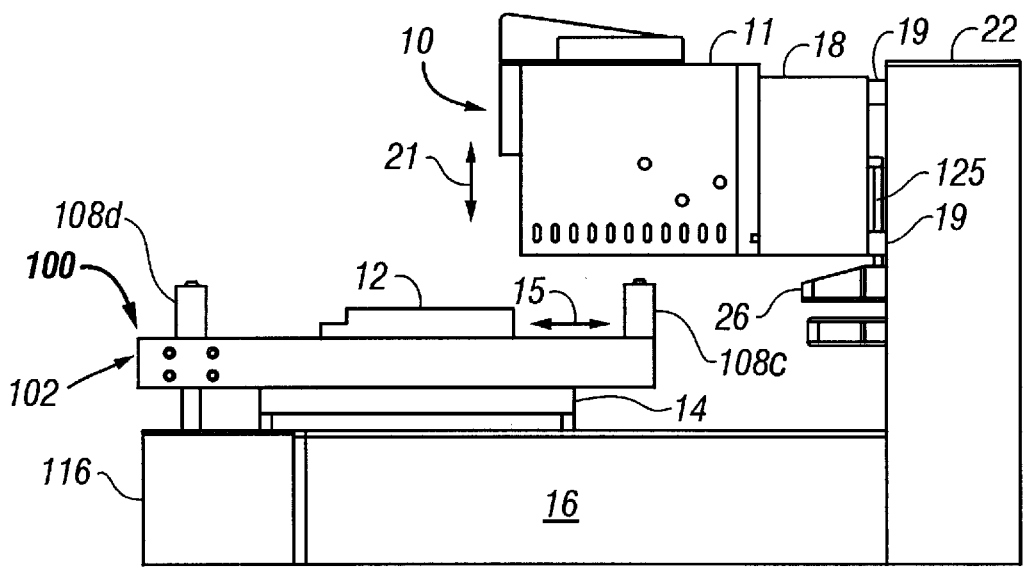
FIG. 3 shows a side view of the substrate lift mechanism coupled to an integrated metrology tool.

Advantageously, base 116 is configured to be easily attached to the base of existing or new processing tools. FIGS. 2 and 3 show respective perspective and side views of substrate lift mechanism 100 coupled to an integrated metrology tool 10. Metrology tool 10 may be any type of processing tool in which the transfer of a substrate from an edge grip arm to a chuck is desired. Metrology tool 10, for example, is a Nanospec® 9000i system. Metrology tool 10 includes a chuck 12 mounted on a stage 14 which in turn is mounted on abase 16. Stage 14 moves chuck 12 back and forth in the Y direction as indicated by arrow 15 (shown in FIG. 3). Metrology tool 10 also includes an optics housing 11, which is mounted on a spacer housing 18, which may be manufactured by e.g., Kensington Laboratories, Inc.. Spacer housing 18 is moved up and down in the Z direction, as indicated by arrow 21, by a Z stage 19. The motor for driving Z stage 19 is located within upright housing 22. A prealigner 26, that prealigns a substrate during processing, is mounted on upright housing 22. As shown in FIG. 3, in one embodiment, an arm 125 is mounted on the prealigner 26 and is used as part of the activation mechanism for substrate lift mechanism 100, as will be discussed below.

The base 116 of the substrate lift mechanism 100 is mounted to the front of base 16 of the metrology tool 10, for example, using bolts, screws, or clamps. As shown in FIG. 3, when hoop 102 is in an up position, fingers 108a–108d (only fingers 108c and 108d are shown in FIG. 3) extend above the surface of chuck 12. When hoop 102 is lowered into the down position, fingers 108a–108d will be below the surface of chuck 12.

Figure 4:
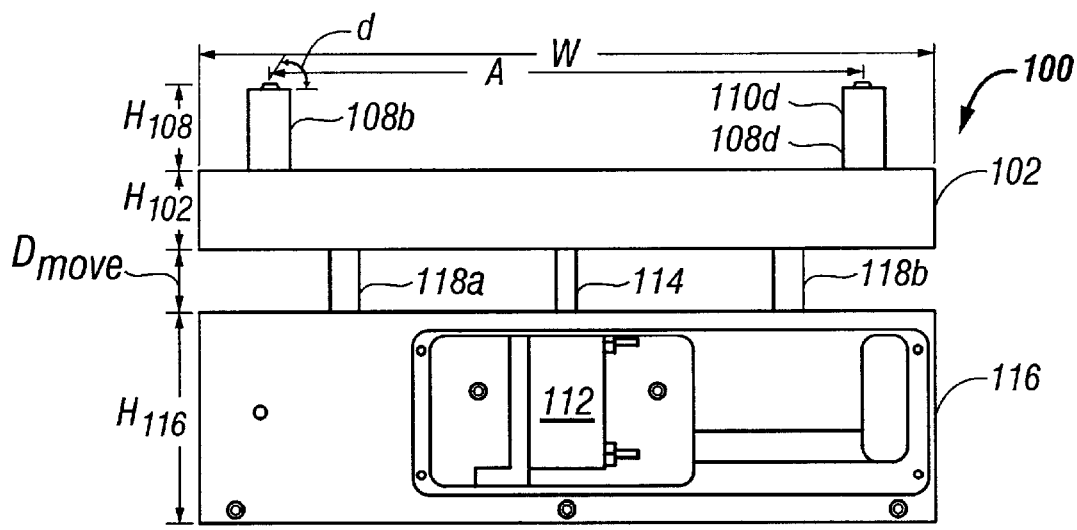
FIG. 4 shows a front view of the substrate lift mechanism.

FIG. 4 shows a front view of substrate lift mechanism 100. As shown in FIG. 4, the center of fingers 108b and 108d are separated by a distance A, which is, e.g., approximately 8.031 inches. Fingers 108a and 108c, which are not shown in this view, are likewise separated by distance A. Positioning nipples 110a–110d form an angle α relative to horizontal, which may be, e.g., 48 degrees. The width of base 116 and of hoop 102, i.e., the outside distance from arm 104 to arm 106 (as shown in FIG. 1A) is a distance W, which is, e.g., approximately 10 inches. The height $H_{116}$ of base 116 is approximately 2.756 inches, the height $H_{102}$ of hoop 102 is approximately 1.000 inches, and the height $H_{108}$ of fingers 108a–108d from the base of the fingers to the top of the positioning nipples 110a–110d is approximately 1.166 inches. Hoop 102 may move upward a distance $D_{move}$, e.g., approximately 0.843 inches, and downward to place hoop 102 in contact with base 116.

It should be understood that while fingers 108a–108d are shown extending upward from arms 104 and 106, alternative configurations may be possible. For example, flattened fingers may extend inwardly from arms 104 and 106 to gravitationally support a substrate.

Figure 5:
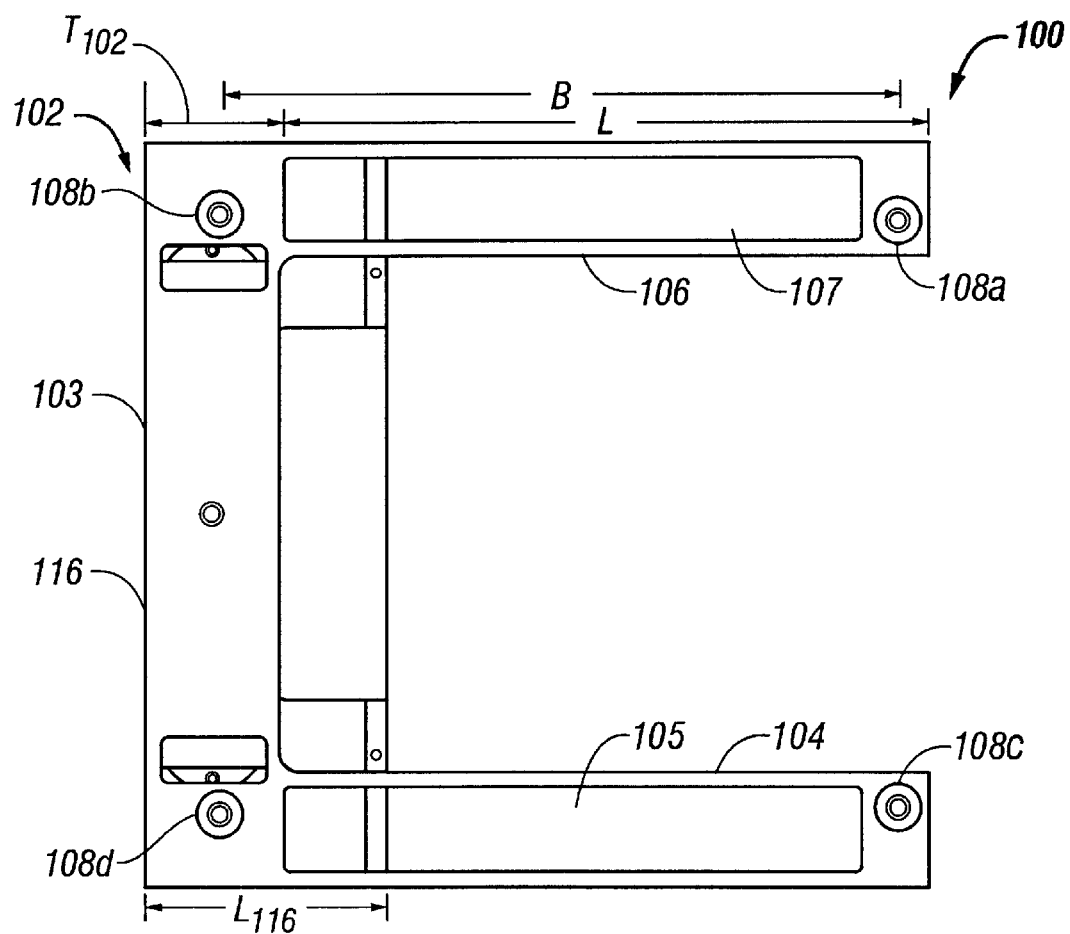
FIG. 5 shows a top view of the substrate lift mechanism.

FIG. 5 shows a top view of substrate lift mechanism 100. As shown in FIG. 5, the center of fingers 108a and 108b (and fingers 108c and 108d) are separated by a distance B, which is e.g., 9.152 inches. Arms 104 and 106 have a length L of approximately 8.768 inches. The front of hoop 102, which connects arm 104 to arm 106, has a thickness $T_{102}$ of approximately 1.838 inches. The length $L_{116}$ of base 116 is approximately 3.292 inches.

Thus, when substrate lift mechanism 100 is mounted on metrology tool 10, as shown in FIGS. 2 and 3, the total footprint is only increased slightly, i.e, by $W \times L_{116}$, which is approximately 32.92 inches². The additional footprint of substrate lift mechanism 100 is an important consideration due to the value of space in a clean room.

It should be understood that the described dimensions of substrate lift mechanism 100 are exemplary and are not intended as limitations. The described dimensions are intended for use with a 300 mm wafer. Any desired dimensions may be used and of course other dimensions will be necessary for use with different sized substrates. Further, the size of base 116 maybe altered as appropriate for proper installation with existing processing tools.

Figure 6:
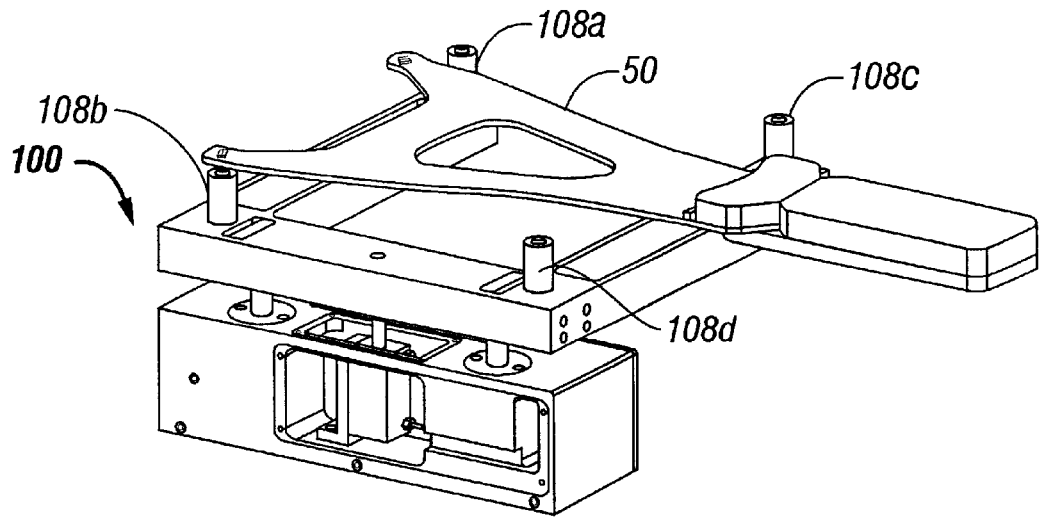
FIG. 6 shows a perspective view of the substrate lift mechanism operating with an edge grip arm.
Figure 7:
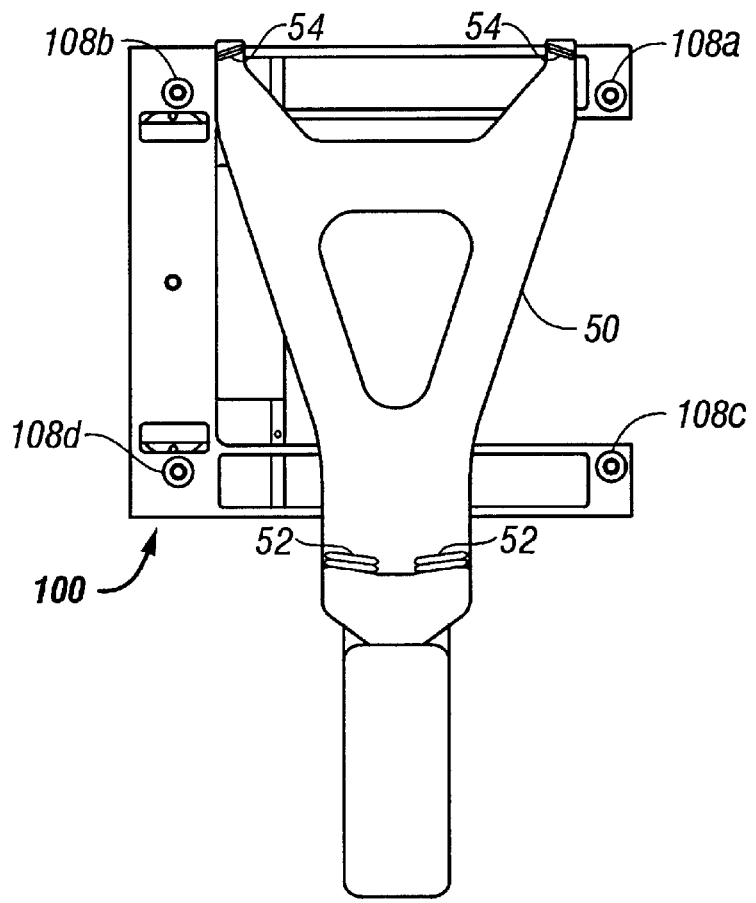
FIG. 7 shows a top view of the substrate lift mechanism operating with an edge grip arm.

FIGS. 6 and 7 show respective perspective and top views of substrate lift mechanism 100 operating with an edge grip arm 50. No substrate is shown in FIGS. 6 and 7 for the sake of clarity. Edge grip arm 50 may be the type manufactured by Kensington Laboratories, Inc. Edge grip arm 50 may include moveable gripping elements 52 that move to press or grip substrate between moveable gripping elements 52 and stationary elements 54. As can be seen, the configuration of edge grip arm 50 with its solid arm construction interferes with the lowering of a substrate onto a chuck. Substrate lift mechanism 100 is advantageously configured to cooperate with edge grip arm 50 by permitting edge grip arm 50 to pass between fingers 108c and 108d. As can be seen in FIG. 7, part of edge grip arm 50 also passes between fingers 108a and 108b. Thus, edge grip arm 50 can transfer a substrate to substrate lift mechanism 100, which then transfers the substrate to the desired position, e.g., a chuck 12 on metrology tool 10. While FIGS. 6 and 7 show edge grip arm 50 entering substrate lift mechanism from a side position, it should be understood that if desired a front loading position may be used as well.

Hoop 102, including arms 104 and 106 and cross bar 103, is manufactured from a light weight but rigid material such as aluminum or aluminum alloy, e.g., aluminum alloy MIC 6. As shown in FIGS. 1 and 5, arms 104 and 106 may include holes 105 and 107, respectively, to reduce weight while maintaining rigidity. Fingers 108a–108d may be manufactured from a hard plastic material, such as poly-ether-ether-ketone (PEEK) or other similar types of plastic. Other materials besides plastic may also be used, but the material should produce little particulate matter to avoid contaminating or otherwise damaging the substrates. Positioning nipples 110a–110d may be integrally formed on fingers 108a–108d. Positioning nipples 110a–110d are shown located in the center of fingers 108a–108d for ease of manufacturing. Fingers 108a–108d are mounted on hoop 102 with bolts, screws, glue or any other appropriate manner, e.g., 2:56 bolts. Base 116 is also manufactured from aluminum or some similar light weight but rigid material. Base 116 should be large enough to encase actuator 112.

Actuator 112 should be small so as to minimize the necessary footprint of substrate lift mechanism 100. Actuator 112 may be, e.g., a pneumatic cylinder manufactured by Compact Air Products, located at Westminster, S.C., as part number T 1/2X1. If desired other types of actuators may be used, such as stepper motors or screw type actuators. Actuator 112 may be directly controlled by a control system, e.g., a microprocessor or digital signal processor.

Figure 8:
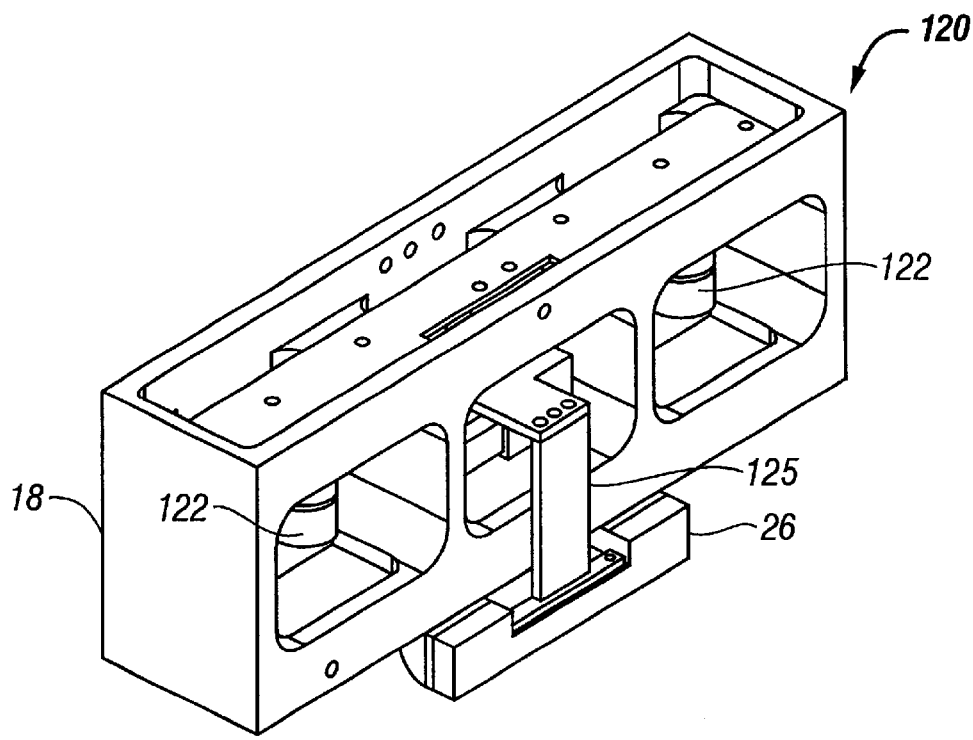
FIG. 8 shows a perspective view of the lift activation electromechanical package, which is part of the metrology tool shown in FIGS. 2 and 3.
Figure 9:
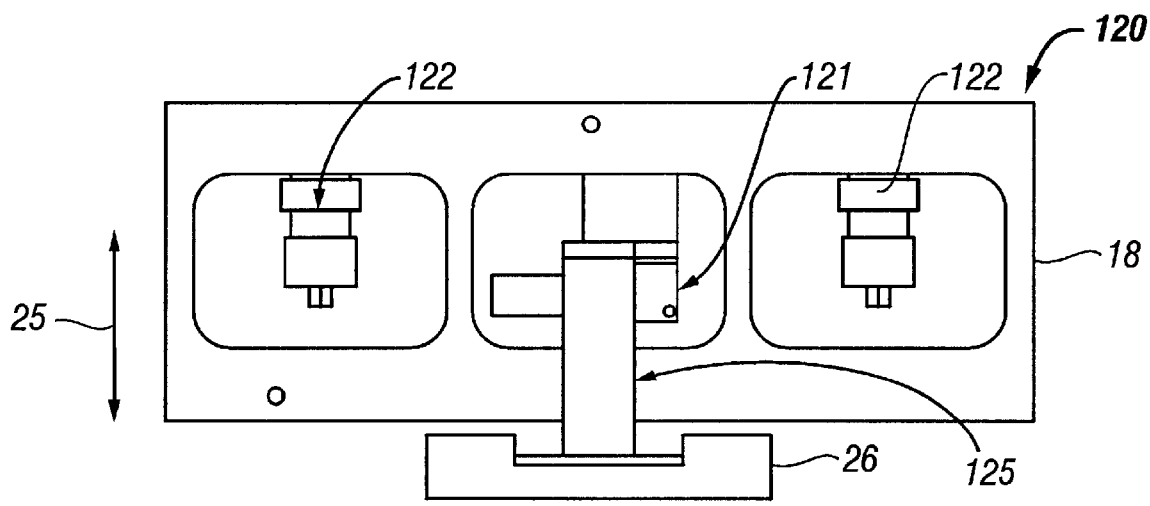
FIG. 9 shows a front view of the lift activation electromechanical package, which is part of the metrology tool shown in FIGS. 2 and 3.

Alternatively, actuator 112 may be controlled by the processing equipment to which substrate lift mechanism 100 is mounted, e.g., metrology tool 10 shown in FIGS. 2 and 3. For example, actuator 112 may be controlled by the movement of chuck 12 or movement of Z-stage 19. FIGS. 8 and 9 show respective perspective and front views of the lift activation electromechanical package 120, which is placed within the spacer housing 18 on metrology tool 10 (shown in FIGS. 2 and 3). As shown in FIGS. 8 and 9, lift activation electro-mechanical package 120 includes two solenoids 122, a micro switch 121 and an arm 125 used to activate micro switch 121. Arm 125 is attached to a fixed point on metrology tool 10, such as prealigner 26, as shown in FIG. 3. The Z stage 19 moves the box spacer housing 18 up and down. When the Z stage 19 moves spacer housing 18 up, the micro-switch 121 comes into contact with arm 125, which does not move. When micro switch 121 contacts arm 125, solenoids 122 are activated thereby causing the pneumatic actuator 112 to raise hoop 102 upward to load a substrate onto substrate lift mechanism 100. Conversely, when the Z stage 19 moves down spacer housing 18 down, the micro switch 121 is released by the arm 125. Thus, solenoids 122 are caused to actuate the pneumatic actuator 112 to lower hoop 102 to place a substrate onto chuck 12.

Micro-switch 121 may be, e.g., part number 50F7426, manufactured by Cherry, Inc., located in Illinois. The solenoids 122 may be, e.g., Clippard Electronic/Pneumatic Valves, model number ETO-3, manufactured by Clippard Instrument Laboratory, Inc., in Cincinnati, Ohio. The Z stage 19 of metrology tool 10 is conventional and well understood by those of ordinary skill in the art. The movement of the Z stage 19 with the addition of micro-switch 121 and non-moving arm 125 is used advantageously to actuate movement of the substrate lift mechanism 100 without requiring addition of a complicated electrical system.

The sequence of events of loading and unloading a substrate onto a processing tool in accordance with an embodiment of the present invention is as follows. The process of loading a substrate begins with the edge grip arm 50 bringing a substrate to the processing tool. Hoop 102 of substrate lift mechanism 100 is in the home or "up" position. The chuck 12 is in a load position, i.e., the set position where substrates are loaded and unloaded. The edge grip arm 50 enters A the substrate lift mechanism 100 between a pair of fingers either from a side load position or from a front load position. The edge grip arm 50 releases the substrate by retracting moveable gripper elements 52 (shown in FIG. 7) and then lowers the substrate onto fingers 108a–108d. The edge grip arm 50 then retracts from substrate lift mechanism 100, i.e., from between fingers 108a and 108b or fingers 108c and 108d if in a side load position, or between fingers 108b and 108d if in a front load position. Z stage 19 moves down a small amount, e.g., 2.5 mils, causing arm 125 to release micro-switch 121, which causes actuator 112 to lower hoop 102. As hoop 102 lowers, the substrate is placed on chuck 12 and may then be processed. Chuck 12 may hold the substrate in any conventional manner, including vacuum, gravity or electrostatic.

To unload a substrate the chuck 12 moves to the "load" position and hoop 102 is already in the lowered or "down" position. The Z stage 19 moves up approximately 2.5 mils causing the arm 125 to be strike micro-switch 121, which causes actuator 112 to raise hoop 102 thereby lifting the substrate off chuck 12. The edge grip arm 50 moves under the substrate and then lifts the substrate off fingers 108a–108d. The moveable gripper elements 52 are moved to grip the substrate and the edge gripper arm 50 then retracts from the processing tool thereby removing the substrate from the processing tool.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, various types of materials and dimensions may be used in accordance with the present invention. Thus, the spirit and scope of the appended claims should not be limited to the foregoing description

What is claimed is:

1. A method comprising:
    positioning a plurality of fingers in an up position, said fingers being moveably mounted on a base;
    positioning a substrate over said plurality of fingers, said substrate being held on an edge grip arm;
    lowering said edge grip arm to place said substrate on said plurality of fingers;
    retracting said edge grip arm between at least two of said plurality of fingers; and
    lowering said fingers to a down position to place said substrate on a chuck of a processing tool.

2. The method of claim 1, wherein said plurality of fingers are mounted on a hoop, said hoop being moveably mounted on said base, said fingers are raised and lowered by raising and lowering said hoop.

3. The method of claim 2, further comprising:
    raising said hoop to said up position to place said substrate on said plurality of fingers;
    extending said edge grip arm between two of said plurality of fingers;
    raising said edge grip arm to place said substrate on said edge grip arm; and
    retracting said edge grip arm to remove said substrate from said processing tool.

4. The method of claim 1, further comprising positioning said substrate on said plurality of fingers, wherein positioning said substrate on said plurality of fingers is performed by positioning nipples centering said substrate over said plurality of fingers.

5. The method of claim 2, wherein lowering said hoop to a down position comprises moving a Z stage on said processing tool to control an actuator coupled to said hoop.

6. The method of claim 2, wherein raising said hoop to an up position comprises moving a Z stage on said processing tool to control an actuator coupled to said hoop.

7. A method of loading and unloading a substrate onto and off of a chuck, said method comprising:
    gripping a substrate at the edges of said substrate by an arm;
    moving said arm to position said substrate over said chuck;
    loading said substrate on a plurality of fingers;
    retracting said arm between at least two of said plurality of fingers; and
    lowering said plurality of fingers to load said substrate on said chuck.

8. The method of claim 7, comprising:
    raising said plurality of fingers to unload said substrate off said chuck;
    moving said arm between said at least two of said plurality of fingers;
    loading said substrate on said arm and gripping said substrate at the edges of said substrate; and
    retracting said arm with said substrate.

9. The method of claim 7, wherein loading said substrate on a plurality of fingers comprises lowering said arm to place said substrate on said plurality of finger.

10. The method of claim 8, wherein loading said substrate on said arm comprises raising said arm to place said substrate on said arm.

* * * * *